(12) United States Patent
Korobochko et al.

(10) Patent No.: US 9,170,505 B2
(45) Date of Patent: Oct. 27, 2015

(54) ARRANGEMENT FOR GENERATING EUV RADIATION

(75) Inventors: Vladimir Korobochko, Goettingen (DE); Juergen Kleinschmidt, Goettingen (DE)

(73) Assignee: USHIO Denki Kabushiki Kaisha, Tokyo (JP)

( * ) Notice: Subject to any disclaimer, the term of this patent is extended or adjusted under 35 U.S.C. 154(b) by 1759 days.

(21) Appl. No.: 12/254,272

(22) Filed: Oct. 20, 2008

(65) Prior Publication Data

US 2009/0101850 A1     Apr. 23, 2009

(30) Foreign Application Priority Data

Oct. 22, 2007   (DE) .................. 10 2007 051 295

(51) Int. Cl.
*H05G 2/00*     (2006.01)
*G03F 7/20*     (2006.01)

(52) U.S. Cl.
CPC ........ *G03F 7/70916* (2013.01); *G03F 7/70033* (2013.01); *G03F 7/70083* (2013.01); *H05G 2/003* (2013.01)

(58) Field of Classification Search
USPC ............... 250/493.1, 496.1, 503.1, 504 R; 315/111.01, 111.21, 111.31, 111.41, 315/111.71
See application file for complete search history.

(56) References Cited

U.S. PATENT DOCUMENTS 7,011,733 B2 *   3/2006   Sandhu ............ 204/192.15
7,365,350 B2     4/2008   Tran et al.
2004/0145292 A1*   7/2004   Ahmad et al. ........... 313/231.31
2007/0023711 A1*   2/2007   Fomenkov et al. ....... 250/504 R
2007/0080307 A1*   4/2007   Bruijn et al. ............. 250/504 R

FOREIGN PATENT DOCUMENTS

DE        102 37 901 B3       5/2004

OTHER PUBLICATIONS

"ECR plasma as an ion source," CEA—Commissariat a L'Energie Atomique (FR), CEA-Grenoble, Feb. 2005.
Oechsner, H., "Electron Cyclotron Wave Resonances and Power Absorption Effects in Electrodeless Low Pressure H.F. Plasmas with a Superimposed Static Magnetic Field," Plasma Physics, vol. 16, 1974, pp. 835-844.

* cited by examiner

*Primary Examiner* — Nicole Ippolito
*Assistant Examiner* — Hanway Chang
(74) *Attorney, Agent, or Firm* — Patent International, P.C.

(57) ABSTRACT

The invention is directed to an arrangement for generating EUV radiation particularly for source modules in exposure installations for EUV lithography for semiconductor chip fabrication. The object of the invention, to find a novel possibility for realizing an EUV source module which appreciably improves the ratio of resources to results in the transfer of radiation from the primary source location (plasma 3) to the secondary source location (output opening (6) of the source module (1)/intermediate focus plane (62)), is met according to the invention in that the plasma (3) is formed as a volume emitter for direct illumination of the output opening (6) without collector optics (5), and the transverse dimension (d) of the plasma (3) is greater than the diameter (D) of the output opening (6), wherein the extent to which the diameter is exceeded depends on the distance (L) between the plasma (3) and the output opening (6) and on the numerical aperture (NA) of the illumination system downstream.

13 Claims, 4 Drawing Sheets

ARRANGEMENT FOR GENERATING EUV RADIATION

RELATED APPLICATIONS

This application claims priority to German Patent Application No. DE 10 2007 051 295.5, filed on Oct. 22, 2007, which is incorporated herein by reference in its entirety.

FIELD OF THE INVENTION

The invention is directed to an arrangement for generating EUV radiation comprising a vacuum chamber with a plasma generation arrangement for generating a radiation-emitting plasma, a debris filter, and a radiation output opening which presents a secondary source location with respect to the primary emitting plasma such as is required particularly in exposure installations for EUV lithography for semiconductor chip fabrication.

BACKGROUND OF THE INVENTION

In semiconductor chip technology, EUV lithography is the next-generation lithography exposure apparatus for generating chip structures in the range of ≤32 nm. The quality of the lithographic imaging is determined by an illumination system for the homogeneous illumination of a mask (reticle) and an optical imaging system for transferring the mask structure to the wafer.

The illumination system contains the actual source module 1 which—as is shown in FIG. 2—usually has a plasma generation arrangement 2 for ionization of gas for the plasma 3 which, e.g., emits a radiation in the EUV spectral region, a debris filter 4, and a radiation collector 5. The collector 5 images the primary source location of the plasma 3 inside the source module 1 in an intermediate focus 61 forming a secondary source location, as it is called, in the intermediate focus aperture 62 at the output of the vacuum chamber 11 of the source module 1. Downstream of the secondary source location (intermediate focus 61) in the direction of a lithographic illumination system, the radiation should be free of debris and spectrally filtered.

Usually, arrangements of reflectors 51 which are nested one inside the other in a rotationally symmetric manner are used for focusing the highly divergent radiation from the plasma 3. The reflectors 51 are usually thin nickel plates which are coated on the inner side with suitably reflecting metal layers (e.g., molybdenum, ruthenium, rhodium, palladium, etc.). All of the reflector shells reflect in grazing incidence at incident angles of <15°. With large aperture angles in particular, optically advantageous collectors 5 based on a Wolter design are used (see FIG. 2a). Multiple reflections on nested multi-shell reflectors 51 are used for focusing, as is shown in FIG. 2a, as a combination of hyperboloids of revolution 52 and ellipsoids of revolution 53.

For production-ready equipment for semiconductor lithography, there are certain defined specifications in the intermediate focus 61 (secondary source location, intermediate focus aperture 62 or output opening of the source module). Apart from the required far-field intensity distributions based on the required homogeneous illumination in the reticle plane, possibly the most important requirement is that the EUV radiation output in the intermediate focus be greater than 115 W at a given etendue.

The etendue (radiant flux) is a predetermined fixed value for the entirety of the optical system. For future EUV lithography scanners, etendue values of 3.3 sr·mm$^2$ are being discussed. This value is given by specific vignetting (through apertures or the like) existing in the beam path and determines, along the light path, what the size of the diameter of the beam bundle may be and what the maximum angles of the beams relative to the optical axis may be without certain portions of the beams being shadowed by any apertures. As a good approximation for small angles relative to the optical axis, it may be estimated that the square of the effective diameter of the luminous region multiplied by the solid angle of the collector with respect to the source point is approximately equal to the square of the diameter of the aperture in the intermediate focus multiplied by the solid angle of the radiation in direction of the intermediate focus.

Accordingly, the situation at the collector is as follows: With a solid angle of the collector relative to the emitting plasma (primary source location) of 3.14 sr (π-collector, aperture angle 60°) and a solid angle of the radiation in direction of the intermediate focus (secondary source location) in the range of 0.03 sr to 0.2 sr (depending on the increase in the collector), there are exact calculations with an aperture opening of about 10 mm in the plane of the secondary source location, a maximum permissible diameter of the emitting source region <1 . . . 1.3 mm, and maximum lengths in axial direction of <1 . . . 1.6 mm. Additional radiation losses occur for larger dimensions so that considerable efforts must be directed toward a spatially strictly limited and very dense plasma.

With required radiation outputs in excess of 115 W in the intermediate focus, the collector is typically acted upon by a total radiation output of >20 kW. Assuming an average reflection factor of 50%, then 50% of the radiation impinging on the reflecting surfaces is absorbed in the collector. Given that the end faces of the nested collector shells are optically dull, a considerable portion of radiation is additionally absorbed at these end faces so that the incident radiation output is dissipated by the collector on the whole chiefly as heat output. The high thermal loading of the collector causes distortions in the far-field intensity distribution and, therefore, degradation of the homogeneity of the far-field intensity distributions behind the intermediate focus. Further, the arrangement of a cooled collector is complicated because cooling pipes must be arranged in the radiation shadows to prevent further radiation losses through shadowing.

Manufacture of the collector is very complicated on the whole and is consequently extremely expensive. In order to prolong the life of the collector optics, they must be protected by corresponding debris filters against fast ions from the plasma and sprayed electrode material. Since collectors customarily have diameters of ~500 mm, the debris filters must likewise have large dimensions. Debris filters are a filigree construction of many specially arranged plates (see, e.g., DE 102 37 901 B3 or DE 10 2005 020 521 A1) which are likewise very expensive to produce. Another disadvantage of the large collector optics is the required vacuum chamber with dimensions of approximately 1 m in diameter and 1.5 to 2 m in length. Apart from high costs, this causes long pumping times above all.

The essential parameter for the source module in its entirety, comprising the plasma generation arrangement, debris filters and collector, is the collection efficiency, as it is called. This expresses as a percentage how much of the radiation output generated in the solid angle 2π arrives behind the intermediate focus aperture. Currently, collection efficiencies of 1.5% to 3% are achieved in so-called α-tool sources. Accordingly, this collection efficiency is disproportionately low compared to the enormous constructional and monetary resources required.

SUMMARY OF THE INVENTION

It is the object of the invention to find a novel possibility for realizing an EUV source module which appreciably improves the ratio of resources to results in the transfer of radiation from the primary source location (plasma) to the secondary source location (output opening of the source module/intermediate focus plane).

According to the invention, this object is met in an arrangement for the generation of EUV radiation in which a plasma generation arrangement which generates a spatially definitely limited hot plasma as primary source location is provided in a vacuum chamber having an output opening for defining a homogeneously illuminated secondary source location for an exposure system located downstream, and at least one debris filter is arranged between the plasma and the output opening. The invention is characterized in that the plasma is formed as a volume emitter for direct illumination of the output opening without collector optics, and the transverse dimension of the plasma is greater than the diameter of the output opening, wherein the extent to which the diameter is exceeded depends on the distance between the plasma and the output opening and on the numerical aperture of the illumination system downstream.

The emitting plasma advantageously has a transverse dimension of $d \approx (D+2L*NA)$. The EUV-emitting plasma is advisably generated as a gas discharge plasma at an electrode arrangement. In this connection, it is preferably generated in the gas volume between the anode and cathode or as a sliding discharge along an insulator surface.

In an advantageous construction, the cathode is formed as a cylindrical or slightly conical hollow cathode, and a ring electrode which is mounted in front in direction of the output opening of the source module is provided as anode.

In this connection, the debris filter arranged downstream can advantageously be switched as an anode In another preferred embodiment form, the EUV-emitting plasma is generated as a sliding discharge along an insulator. The cathode is constructed as a center electrode around which a tubular insulator and the anode are arranged substantially coaxially, and the discharge is carried out at the front side of the electrode arrangement radially along the insulator surface.

The insulator is advisably made of a material with a high relative permittivity such as, e.g., lead zirconate titanate (PZT), lead boron silicate, or lead zinc boron silicate. Further, the insulator can be fashioned from a highly-insulating ceramic such as $Si_3N_4$, $Al_2O_3$, AlZr, AlTi, BeO, SiC, or sapphire.

In another basic construction, the EUV-emitting plasma is generated by high-frequency excitation. For this purpose, the EUV-emitting plasma can advantageously be generated by electron cyclotron resonance excitation (ECRH).

The invention is based on the fundamental consideration that that the collection efficiency of an EUV source module is improved only minimally by a further increase in the already enormous expenditure on the collector and debris filters. Based on the usual dimensions of the intensively emitting plasmas and an additional EUV radiation from a large emission volume with dimensions in the centimeter range, the EUV absorption in the working gas, and the shadowing in the debris filter and in the collector (collector mount), it can be estimated that even with further improvements the EUV collection efficiency remains appreciably below 10% in gas discharge sources (future production line equipment estimates are approximately 5% to 7%).

Further, in view of the fact that numerical input apertures of the illumination system of $NA \approx 0.4$ are to be permitted for EUV production scanners, the idea of fundamentally simplifying the collector system has reached fruition; that is, when the collection efficiency approximately equals the ratio of the solid angle $\Omega$ per $2\pi$ given by the illumination optics, the use of an extremely expensive collector per se is superfluous.

With a permissible numerical aperture of the illumination system of $NA \approx 0.4$, the above-mentioned ratio is $\Omega/2\pi \approx \pi NA^2/2\pi \approx 8\%$. This is thoroughly comparable to the collection efficiency that can be achieved by a good collector. Therefore, the invention solves the problem of the poor expenditure-to-utility ratio in the collection efficiency of the source module by generating definitely expanded plasma which renders a collector completely superfluous.

The invention makes it possible to realize an EUV source module in which the required radiation output is reached at the output opening of the source module with appreciably reduced expenditure.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
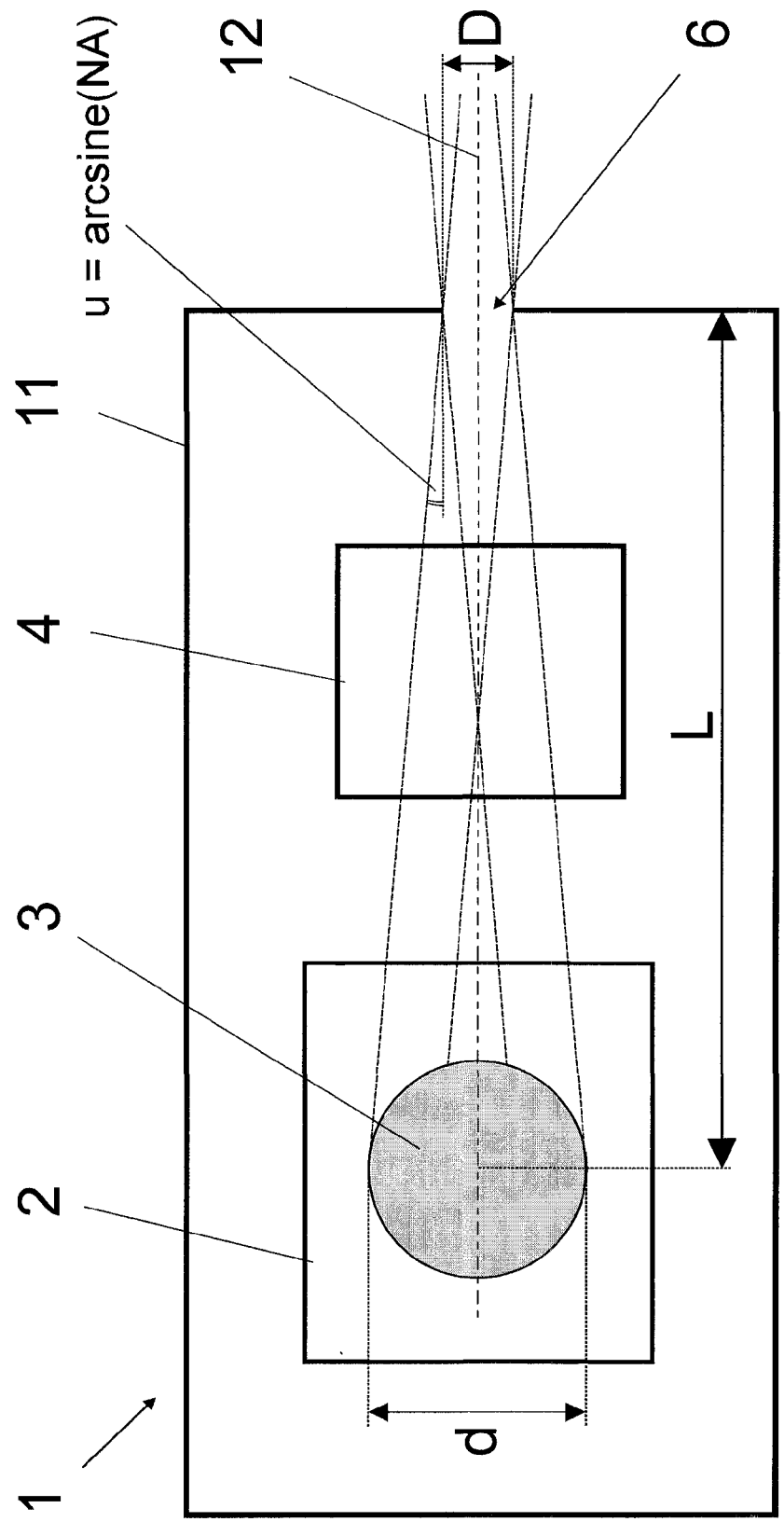
FIG. 1 shows a basic construction of the EUV source module according to the invention.

As is shown in FIG. 1, the basic construction of the EUV source module 1 comprises a plasma generation arrangement 2 which generates a relatively large-volume plasma 3 and a debris filter 4. A vacuum chamber 11 enclosing the source module 1 has, along an optical axis 12, a defined output opening 6 which corresponds to the conventionally specified intermediate focus plane 62 with respect to the spatial position and orientation for the downstream lithography exposure system (not shown).

The source module 1 is constructed in such a way that the transverse dimension d of the plasma 3 (diameter of the plasma 3 lateral to the optical axis 12) is greater than the diameter D of the output opening 6 of the source module 1 and that a homogeneous, intensive illumination of the output opening 6 (formerly, the intermediate focus plane 62) is carried out without a collector 5. Since the radiation exiting from the output opening 6 is to be free of debris, there must be sufficient space available for the debris filter 4, for which reason a determined distance L must be maintained between the plasma 3 and output opening 6.

Figure 2:
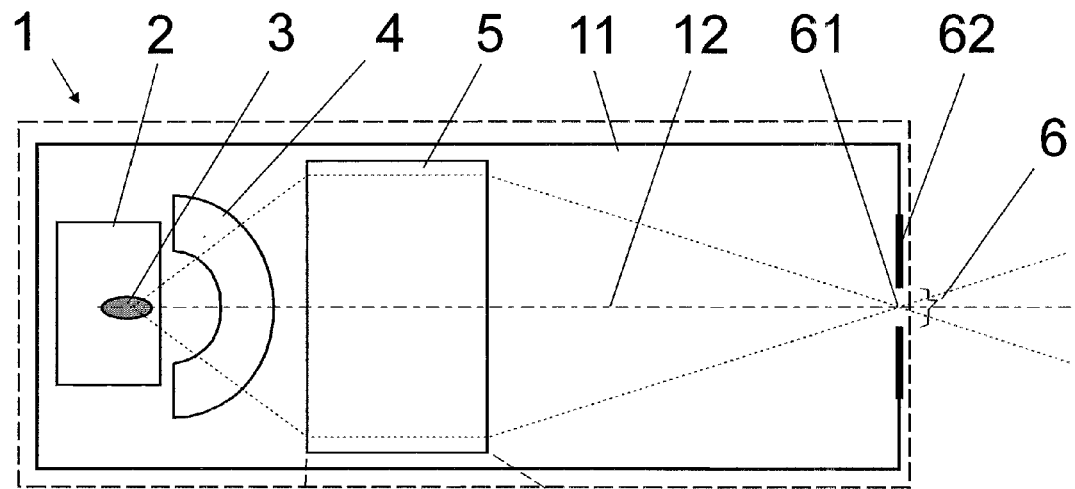
FIG. 2 shows the conventional construction of an EUV source module according to the prior art.
Figure 2A:
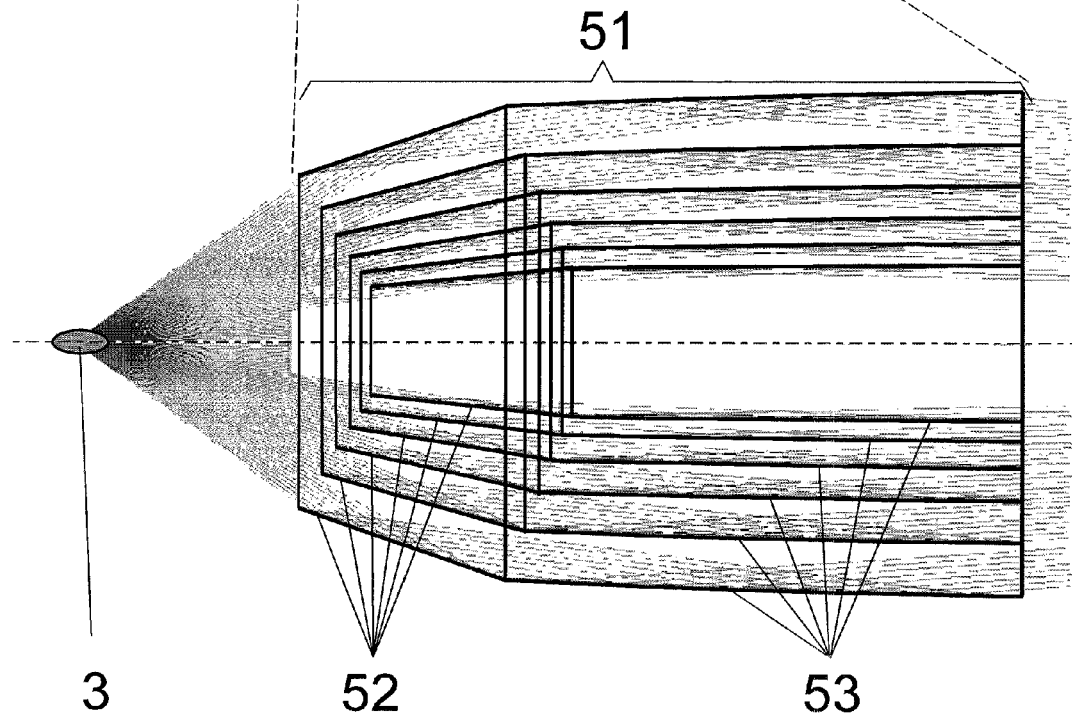
FIG. 2a shows a collector comprising six nested shells (Wolter type with twofold reflection)

For purposes of a homogeneous illumination of the output opening 6, the effective diameter d of the plasma 3, i.e., the luminous region "visible" through the output opening 6, must be greater than the diameter D of the output opening 6. This results from the fact that the radiation cone—given by the numerical aperture NA of the lithography illumination system downstream (not shown)—passing through every point of the output opening 6 may only have a maximum angle of 2 arcsine (NA) so that its radiation components can pass through the illumination optics without additional geometric losses. Therefore, the given numerical aperture NA of the illumination system downstream furnishes a condition for the transverse dimension d of the plasma 3 such that the selected distance L of the plasma 3 from the output opening 6 can be:

$d \approx D+2L \cdot NA$, depending on the plasma diameter d. A plasma such as that which was required for collector imaging with particle concentrations of $10^{15}$ cm$^{-3}$ with plasma diameters in the millimeter range can now be distributed as plasma 3 to a substantially greater volume and the quantity of the emission centers is retained because there is no longer any limiting to the detectable solid angle of a collector 5 (see FIG. 2a).

Figure 3:
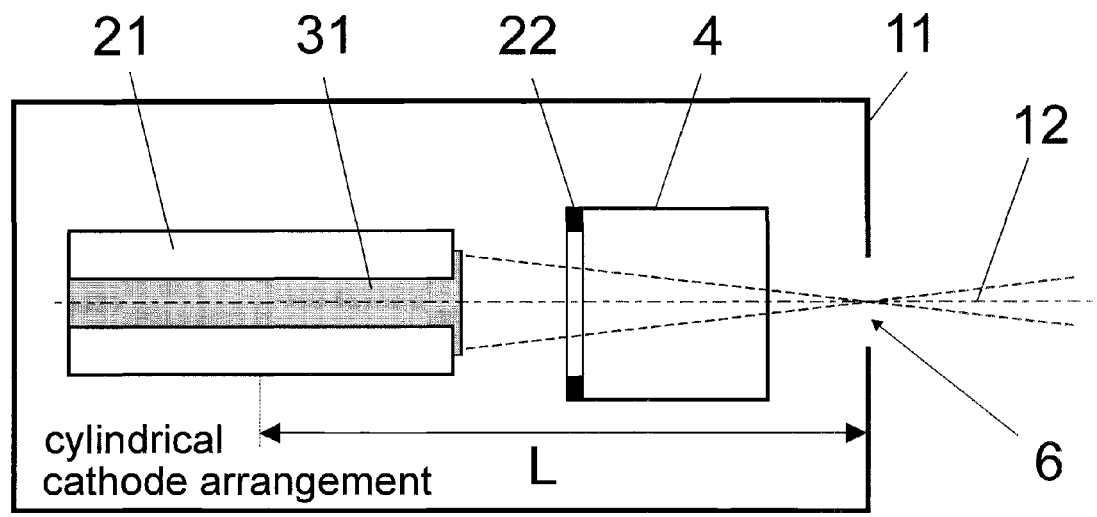
FIG. 3 shows a cylindrical cathode arrangement for generating an axially expanded, optically thin discharge plasma.
Figure 4:
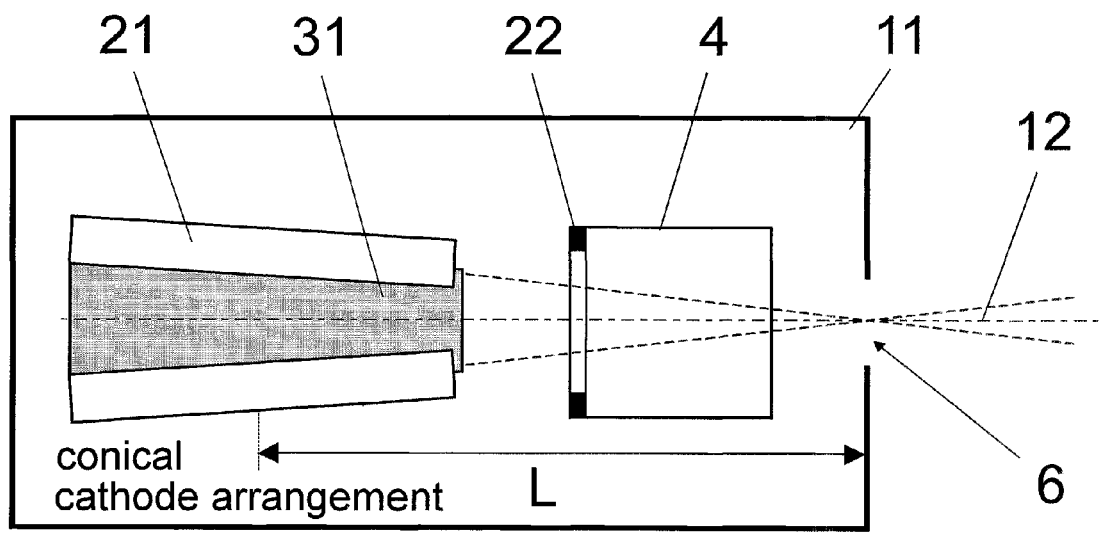
FIG. 4 shows a conical cathode arrangement without a collector with an axially expanded, optically thin discharge plasma.
Figure 5:
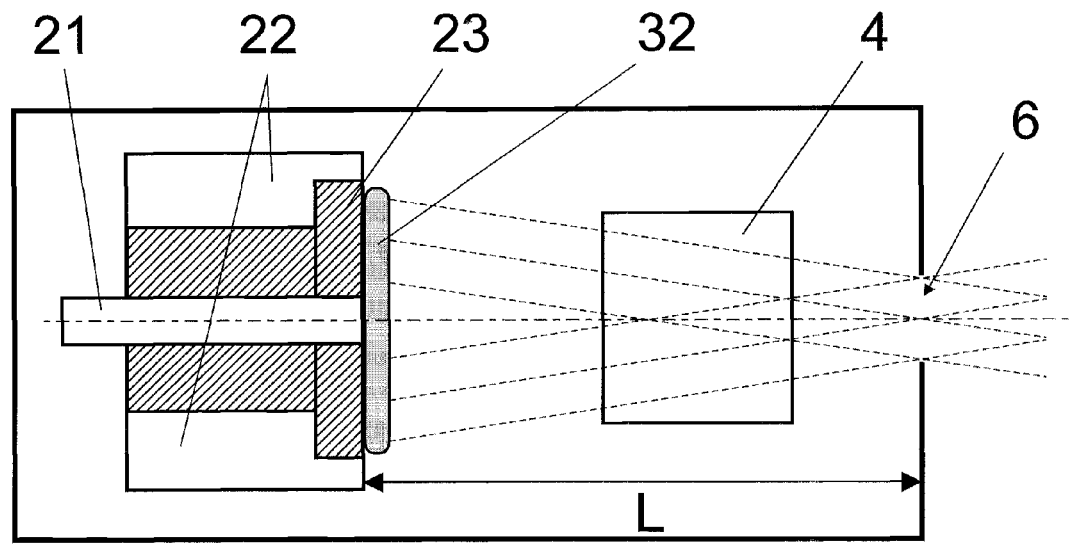
FIG. 5 shows an electrode arrangement with laterally extensive, optically dense discharge plasma by means of a sliding discharge.

FIGS. 3, 4 and 5 each show a source module 1 containing gas discharge arrangements in different spatial arrangements for generating the emitting plasma 3. FIGS. 3 and 4 are electrode arrangements comprising cathode 21 and anode 22 for a gas discharge which is formed in such a way that an elongated optically thin plasma 31 results along the optical axis 12. In both cases, the anode 22 can be arranged at the debris filter 4 as a ring electrode in order to maintain a short distance from the output opening 6 of the source module 11. The output opening 6 corresponds to the opening in the above-mentioned intermediate focus plane 62 according to the prior art.

The center of the actually luminous plasma is at a distance L from the output opening 6. Every point in the output opening 6 (formerly, intermediate focus plane 62) receives a radiation cone (indicated in FIG. 1 and FIG. 5) from the luminous region in the cathode 21 with $\Omega \sim \pi NA^2$; only the radiation components contained in this radiation cone can pass without losses through an illumination system (entrance optics) following the output opening 6.

The radiating, optically thin plasma is shown schematically in FIGS. 3 and 4 such that it fills up the entire cathode cavity in a completely homogeneous manner. However, this is generally not the case because optically thin sliding discharges can also form and be used in addition to volume discharges.

For homogeneous illumination of the output opening 6 (formerly, intermediate focus plane 62), the selected effective diameter d of the plasma 31 is approximately D+2L·NA (D is the diameter of the output opening 6). As was explained above referring to FIG. 1, the radiation cone occurring at every point in the output opening 6 may only have the angle of 2 arcsine (NA) so that it can enter the illumination optics without geometric losses. L≈50 mm and NA≈0.25 give a plasma diameter d≈20-30 mm. In this connection, L is a quantity such that the debris filter 4 can be positioned between the discharge arrangement and the output opening 6 (also: DMT=Debris Mitigation Tool).

The z-dimension of an optically thin plasma 31 is only limited by the self-absorption of the emitted radiation (e.g., EUV: 13.5 nm) to approximately z≈1/σN (N is the number of emitters per volume=plasma density, σ is the absorption cross section). The z-dimension of the cathode 21 when generating an optically thin plasma 31—depending on the plasma density N—is typically in the range of 2 cm to 10 cm.

An optically dense plasma 32 according to FIG. 5 is characterized by a very high emitter density N. As a result, the z-dimension of the plasma is small compared to the plasma diameter ≈D+2L·NA. Very high plasma densities N are generated by sliding discharges on ceramic surfaces. This is shown, for example, in FIG. 5. In this case, a sliding discharge takes place between a central cathode 21 and a radially surrounding anode 22 on a ceramic surface of a tubular insulator 23. Such discharges can be carried out in a very defined manner and have the advantage that they have a high emission efficiency for radiation in the short-wavelength UV (also EUV) and X-ray regions over a large pressure range (up to several kPa).

In all of the cases described above, the selected electrode geometry can be relatively large because of the comparatively large dimensions of the plasma. This has the advantage that the electrodes 21 and 22 can be effectively cooled.

Figure 6:
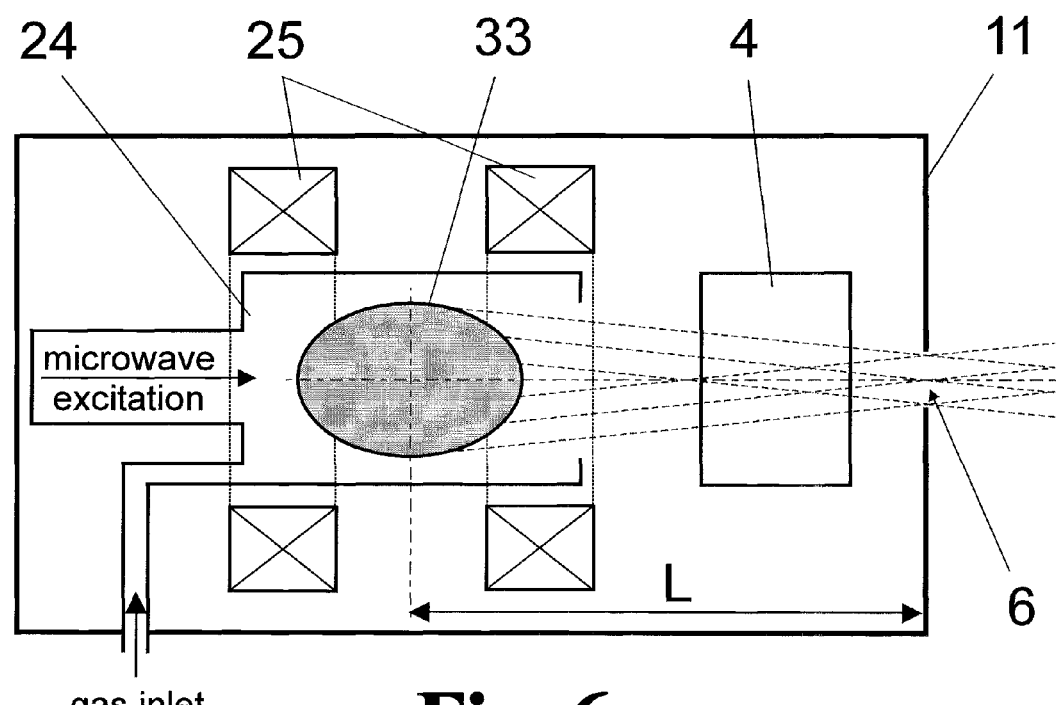
FIG. 6 shows an electron cyclotron resonance with a microwave-magnetic mirror arrangement for generating a plasma.

FIG. 6 illustrates another possibility for realizing the invention using plasma generated by electron cyclotron resonance or ECRH (Electron Cyclotron Resonance Heating) as is described, for example, by H. Oechsner, Plasma Physics 16 (1974), 835, or as ECR plasma by CEA—Commissariat à l'Energie Atomique (FR), CEA-Grenoble, February 2005.

ECRH which has long been known—as has the input of energy in gases by means of high-frequency or microwave excitation in general—has the advantage that no electrodes are needed because of the H—F excitation.

However, the ECRH plasma 33 which is generated in so doing is characterized by comparatively low plasma density and large volume. In principle, the generation of HF-excited optically thin plasmas with diameters of ≈3 cm and lengths of ≈5 cm does not present a problem. However, a luminous ECRH plasma 33 of this kind with a volume of ≈50 cm$^3$ would be much too large spatially when using conventional EUV arrangements with a collector 5 because of the etendue limiting (see comments on page 2 above).

For purposes of the present concept of the collector-free source module 1, however, plasma dimensions in the centimeter range are thoroughly suitable, as was already detailed above referring to FIGS. 3 and 4.

According to FIG. 6, the ECRH plasma 33 which is very expanded spatially per se by microwaves in a microwave excitation arrangement 24 is spatially limited to about 2 to 5 cm in direction of the optical axis 12 by a magnetic mirror arrangement 25.

Accordingly, the collector-free source module 1 presented herein makes it possible for the first time to also use microwave-generated and HF-generated plasma 33 as radiation sources for semiconductor lithography.

In all of the constructions of the source module 1 described above, the debris filter 4 arranged between the plasma generation arrangement 2 and the output opening 6 has substantially smaller transverse dimensions of only a few centimeters. Accordingly, it is substantially smaller than the debris filters 4 currently used in combination with a collector 5.

Since the distances between the plasma generation arrangement 2, debris filter 4 and output opening 6 are much shorter on the whole (typical axial dimensions of 10 to 20 cm) than the collector arrangements in current use (>1.5 m to 2 m), the radiation absorption through residual gas in the vacuum chamber 11 is no longer a factor in practice.

The vacuum chamber 11 needed for this purpose likewise has smaller dimensions and can accordingly be evacuated substantially faster and more sustainably.

While this invention has been particularly shown and described with references to preferred embodiments thereof, it will be understood by those skilled in the art that various changes in form and details may be made therein without departing from the scope of the invention encompassed by the appended claims.

What is claimed is:

1. An arrangement for the generating of EUV radiation, comprising:
   a plasma generation arrangement for generating a spatially definitely limited hot plasma having a transverse dimension d and defining a location of a primary source illumination, the plasma generation arrangement located in a vacuum chamber;
   the vacuum chamber having an optical axis and an output opening for defining a location of a homogeneously illuminated secondary source for an exposure system located downstream from the output opening along the optical axis, the output opening having a diameter D; and
   at least one debris filter arranged between the plasma and the output opening,
   wherein the plasma is formed as a volume emitter for direct illumination of the output opening without collector optics, the transverse dimension d of the plasma being greater than the diameter D of the output opening, and
   wherein the difference between d and D depends on a distance L between the plasma and the output opening, and on a numerical aperture NA of the illumination system located downstream from the output opening along the optical axis.

2. The arrangement according to claim 1, wherein the plasma is an EUV-emitting plasma having the transverse dimension d of $\approx(D+2L*NA)$.

3. The arrangement according to claim 1, wherein the plasma is an EUV-emitting plasma formed as a gas discharge plasma at an electrode arrangement in the vacuum chamber.

4. The arrangement according to claim 3, wherein the EUV-emitting plasma is generated in the gas volume between an anode and a cathode of the electrode arrangement.

5. The arrangement according to claim 4, wherein the cathode is formed as a cylindrical or slightly conical hollow cathode, and the anode is a ring electrode which is mounted downstream from the cathode along the optical axis in the direction of the output opening.

6. The arrangement according to claim 3, wherein the EUV-emitting plasma is generated as a sliding discharge on an insulator.

7. The arrangement according to claim 6, wherein the cathode is constructed as a center electrode around which the insulator in a tubular form and the anode are arranged substantially coaxially, and wherein the discharge is carried out at the front side of the electrode arrangement radially along a surface of the insulator.

8. The arrangement according to claim 6, wherein the insulator is made of a material with a high relative permittivity, such as lead zirconate titanate (PZT), lead boron silicate, or lead zinc boron silicate.

9. The arrangement according to claim 6, wherein the insulator is made from a highly-insulating ceramic such as $Si_3N_4$, $Al_2O_3$, AlZr, AlTi, BeO, SiC, or sapphire.

10. The arrangement according to claim 1, wherein the EUV-emitting plasma is generated by high-frequency excitation.

11. The arrangement according to claim 10, wherein the EUV-emitting plasma is generated by electron cyclotron resonance excitation (ECRH).

12. The arrangement according to claim 1, wherein the EUV-emitting plasma is generated by electron cyclotron resonance excitation (ECRH).

13. An arrangement for generating EUV radiation, comprising:
    a plasma generation arrangement for generating a spatially definitely limited hot plasma having a transverse dimension d and defining a location of a primary source illumination, the plasma generation arrangement located in a vacuum chamber;
    the vacuum chamber having an optical axis and an output opening for defining a location of a homogeneously illuminated secondary source for an exposure system located downstream from the output opening along the optical axis, the output opening having a diameter D; and
    at least one debris filter arranged between the plasma and the output opening;
    wherein the plasma is formed as a volume emitter for direct illumination of the output opening without collector optics, the transverse dimension d of the plasma being greater than the diameter D of the output opening;
    wherein the difference between d and D depends on a distance L between the plasma and the output opening, and on a numerical aperture NA of the illumination system located downstream from the output opening along the optical axis;
    wherein the plasma is an EUV-emitting plasma formed as a gas discharge plasma at an electrode arrangement in the vacuum chamber;
    wherein the EUV-emitting plasma is generated in the gas volume between an anode and a cathode of the electrode arrangement;
    wherein the cathode is formed as a cylindrical or slightly conical hollow cathode, and the anode is a ring electrode which is mounted downstream from the cathode along the optical axis in the direction of the output opening; and
    wherein the debris filter can be switched to function as the anode.

* * * * *